(12) United States Patent
Buchinger et al.

(10) Patent No.: US 11,680,826 B2
(45) Date of Patent: Jun. 20, 2023

(54) INDUCTIVE POSITION SENSOR FOR ELECTRONIC THROTTLE CONTROL

(71) Applicant: Integrated Device Technology, Inc., San Jose, CA (US)

(72) Inventors: Andreas Buchinger, Waidhofen/Ybbs (AT); Rudolf Pichler, Stallhofen (AT); Harald Hartl, Graz (AT); Bence Gombor, Graz (AT)

(73) Assignee: Integrated Device Technology, Inc., San Jose, CA (US)

( * ) Notice: Subject to any disclaimer, the term of this patent is extended or adjusted under 35 U.S.C. 154(b) by 467 days.

(21) Appl. No.: 16/691,471

(22) Filed: Nov. 21, 2019

(65) Prior Publication Data

US 2020/0166377 A1 May 28, 2020

Related U.S. Application Data

(60) Provisional application No. 62/771,544, filed on Nov. 26, 2018.

(51) Int. Cl.
*G01D 5/20* (2006.01)
*H05K 1/14* (2006.01)
(Continued)

(52) U.S. Cl.
CPC ............ *G01D 5/2053* (2013.01); *B62K 11/14* (2013.01); *H05K 3/30* (2013.01); *H05K 3/341* (2013.01); *H05K 3/368* (2013.01)

(58) Field of Classification Search
CPC .. H05K 1/142; H05K 1/144; H05K 2201/042; H05K 2201/09018; H05K 2201/09027
See application file for complete search history.

(56) References Cited

U.S. PATENT DOCUMENTS

2008/0054887 A1   3/2008   Lee
2008/0284554 A1*  11/2008  Schroeder ............... H01F 21/10
                                              336/200
(Continued)

FOREIGN PATENT DOCUMENTS

CN   206146372 U   5/2017
CN   107036635 A   8/2017
(Continued)

OTHER PUBLICATIONS

European Search Report, dated Mar. 20, 2020, from European Patent Application No. 19211224.1, pp. 1-9.
(Continued)

*Primary Examiner* — Paresh Paghadal
(74) *Attorney, Agent, or Firm* — Haynes and Boone, LLP

(57) ABSTRACT

A control that can be a throttle control of a handle-bared vehicle is presented. According to some embodiments, a control can include a plurality of circuit boards, each of the circuit boards including a transmission coil, sensor coils, and control circuitry the drives the transmission coil and receives signals from the sensor coils; and one or more targets mounted on a shaft and configured to rotate over the sensor coils of the plurality of circuit boards as the shaft is rotated, wherein the plurality of circuit boards are mounted around the shaft, and wherein the position of the target is determined by the control circuitry as the shaft is rotated.

8 Claims, 5 Drawing Sheets

(51) Int. Cl.
  *H05K 3/30* (2006.01)
  *H05K 3/34* (2006.01)
  *B62K 11/14* (2006.01)
  *H05K 3/36* (2006.01)

(56) References Cited

U.S. PATENT DOCUMENTS

2017/0021725 A1* 1/2017 Heipel ................. G01D 5/2046
2017/0350728 A1 12/2017 Tiemann et al.
2018/0154926 A1* 6/2018 Ohira ..................... B62D 15/02

FOREIGN PATENT DOCUMENTS

DE         10144910 A1 *  5/2002    ............... B62D 6/10
EP          1925533 A1     5/2008
JP         2016-118424 A   6/2016
WO      WO-2018008783 A2 *  1/2018    ............. E06B 9/384

OTHER PUBLICATIONS

Office Action dated Nov. 24, 2020 issued in related Korean Patent Application No. 10-2019-0152375 (8 pages).

* cited by examiner

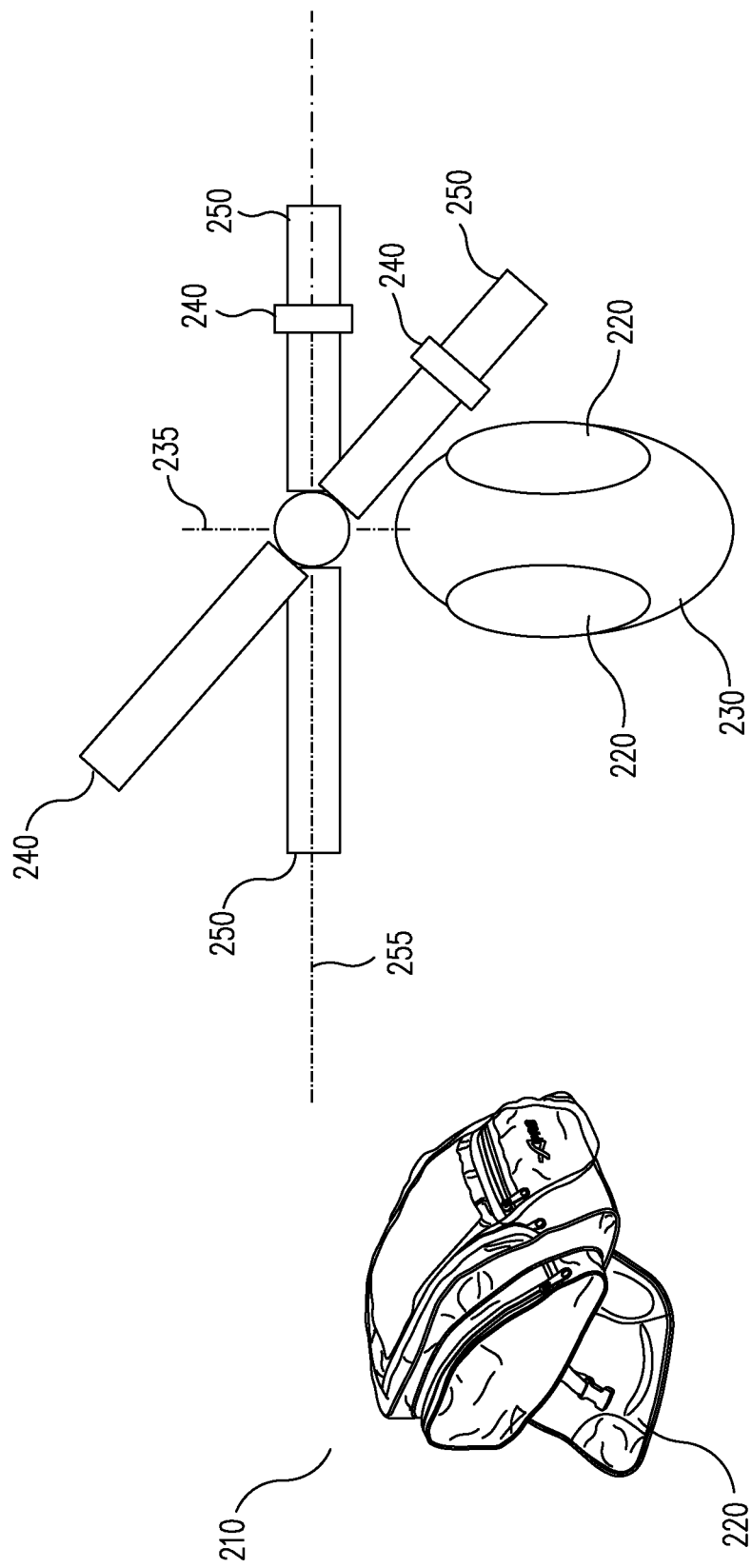

INDUCTIVE POSITION SENSOR FOR ELECTRONIC THROTTLE CONTROL

RELATED APPLICATIONS

This application claims priority to U.S. Provisional Application 62/771,544, filed on Nov. 26, 2018, which is herein incorporated by reference in its entirety.

TECHNICAL FIELD

Embodiments of the present invention are related to inductive sensing of a position of an electronic throttle controls, such as an electronic throttle control on a motorcycle.

Discussion of Related Art

Throttle position detection, such as the position of a rotatable electronic motorcycle throttle control have usually relied on contacting solutions (such as potentiometers) and/or magnetic sensor solutions (such as hall effect and/or Xcel magnetic receptive media (xMR)). Both the contacting and magnetic sensor solutions have manufacturing, installation, and/or operational issues that may make them less than ideal for use in sensing the position of an electronic throttle control.

Therefore, there is a need to develop better methods of sensing throttle position.

SUMMARY

According to some embodiments, a control can include a plurality of circuit boards, each of the circuit boards including a transmission coil, sensor coils, and control circuitry the drives the transmission coil and receives signals from the sensor coils; and one or more targets mounted on a shaft and configured to rotate over the sensor coils of the plurality of circuit boards as the shaft is rotated, wherein the plurality of circuit boards are mounted around the shaft, and wherein the position of the target is determined by the control circuitry as the shaft is rotated.

A method of providing a throttle control according to some embodiments includes positioning a plurality of circuit boards around a shaft, each of the plurality of circuit boards including a transmission coil, sensor coils, and control circuitry that drives the transmission coil and receives signals from the sensor coils; and providing one or more conductive targets mounted to the shaft and positioned proximate the sensor coils of the plurality of circuit boards.

These and other embodiments are discussed below with respect to the following figures.

BRIEF DESCRIPTION OF THE FIGURES

FIGS. 2A and 2B illustrate an example of a failure mode for an electronic throttle control using magnetic position sensing.

These and other aspects of embodiments of the present invention are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

In accordance with some embodiments of the present invention, an electronic rotational control, for example a throttle control, is formed with a plurality of inductive sensors. The plurality of inductive sensors are formed around a rotational grip that can be mounted on a handlebar of a vehicle such as a motorbike.

Figure 1:
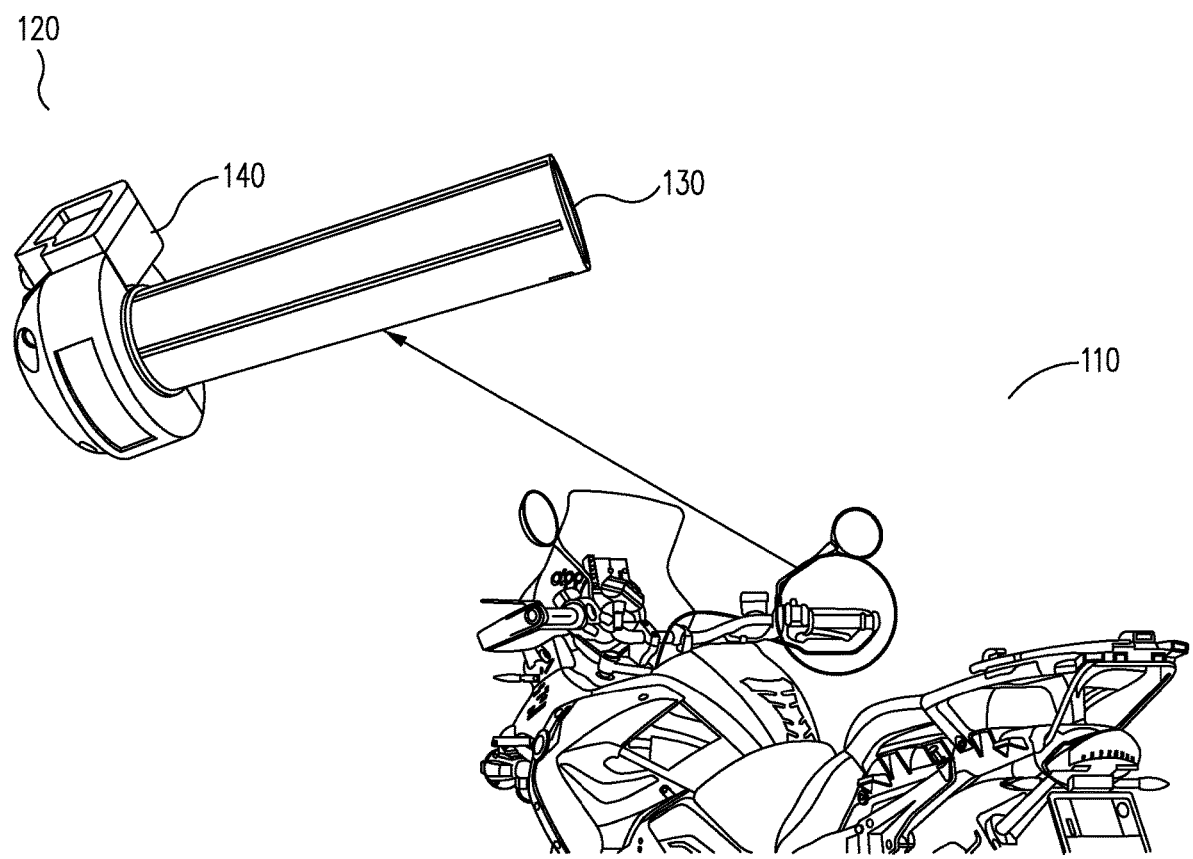
FIG. 1 illustrates an electronic throttle control for a motorcycle according to some embodiments.

FIG. 1 illustrates an electronic throttle control for a motorcycle 110, which may an electronic rotational control according to some embodiments of the present invention. As shown in FIG. 1, motorcycle 110 includes a handle bar with a grip mounted throttle control 130. The throttle of the motorcycle 110 is typically controlled by rotating throttle control 130 relative to a throttle control position detection assembly 140. The position of throttle control 130 is measured by position detection assembly 140 and used by the engine control unit of motorcycle 110 to control the throttle.

Position detection assembly 140 may use any of a number of technologies to detect the position (e.g., the rotation) of throttle control 130 relative to position detection assembly 140. In some examples, position detection assembly 140 may use a contacting solution, such as a potentiometer, to detect the rotational position of throttle control 130. In some examples, use of a contacting solution includes connecting throttle control 130 with the potentiometer (e.g., to the shaft of the potentiometer) so that rotation of throttle control 130 results in rotation of the potentiometer and thus a change in resistance of the potentiometer. In some examples, this approach may be subject to wear, failure of the potentiometer shaft, and/or the like.

In some examples, position detection assembly 140 may use a magnetic sensor solution to detect the rotational position of throttle control 130. In some examples, the magnetic sensor solution may use one or more hall effect and/or xMR-based sensors. In some examples, use of a magnetic sensor solution may be subject to failure modes associated with other stray magnetic fields associated with motorcycle 110.

FIGS. 2A and 2B illustrate an example of a failure mode for an electronic throttle control using magnetic position sensing. As shown in FIGS. 2A and 2B, a gas tank mounted bag 210 for a motorcycle may include one or more magnets 220 used to attach bag 210 to a gas tank 230 of the motorcycle. In order to keep bag 210 in place on gas tank 230, the one or more magnets 220 are typically quite large/strong and typically generate a stray magnetic field. This stray magnetic field may interfere with a magnetic sensor-based position detection assembly 240 used to detect rotation of throttle control 250. For example, when a handle bar 260 of the motorcycle is aligned perpendicular (e.g., along axis 255) to a main front-to-back axis 235 of the motorcycle, the distance between position detection assembly 240 and the one or more magnets 230 is typically large and the stray magnetic field associated with the one or more magnets 230 provides minimal interference with position detection assembly 240. However, when handle bar 260 is rotated to clockwise (such as during a right turn), the distance between the one or more magnets 220 and position detection assembly 240 is reduced. This results in more interference between the stray magnetic field of the one or more magnets 220 and position detection assembly 240. In some examples, this may cause errors in the detected position of throttle control 250 and/or fluctuations in the detected position of throttle control 250 as changes are made in the orientation of handle bar 250 and/or vibrations in handle bar 250 and/or the motorcycle occur. In some examples, this may result in undesirable and/or dangerous changes in the throttle of the motorcycle.

Contact solutions (e.g. potentiometers) can be subject to wear and to interference from foreign objects or corrosion. Such wear can unduly affect the operation of such a throttle. Consequently, other solutions are sought for electronic throttle controls.

Although FIGS. 1, 2A, and 2B illustrate operation of a motorbike throttle control, such controls can be applied to other devices besides motorbikes. Such devices may include, for example, scooters, all-terrain vehicles (ATVs), personal water craft, or other devices that utilize a handlebar with a rotational control.

According to some embodiments of the present invention, use of inductive position sensors may address issues associated with the contacting solution and/or the magnetic sensor solution approaches to throttle control position detection. In some examples, an inductive position sensor according to some embodiments is contactless and avoids the wear and other problems of the contacting solution. Further, inductive position sensors according to some embodiments are insensitive to stray magnetic fields and may be reliably used in the presence of stray magnetic fields, such as those discussed with respect to FIGS. 2A and 2B.

Figure 3A:
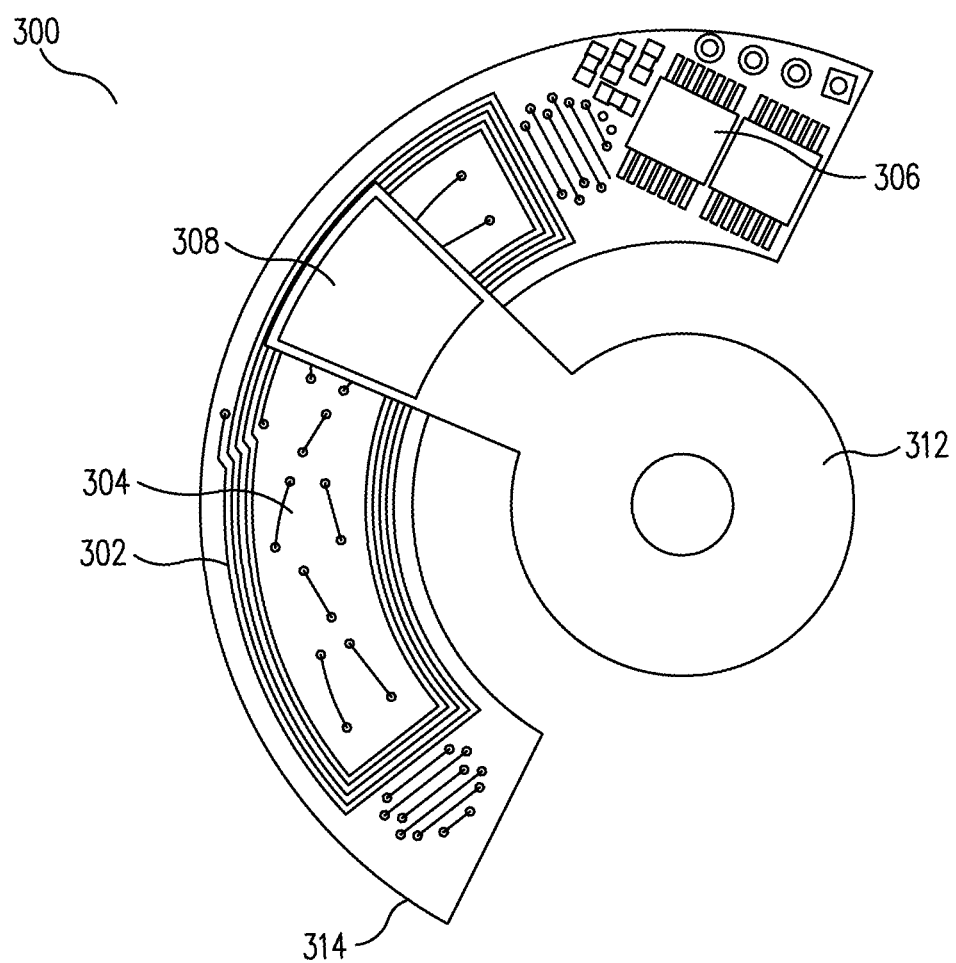
FIG. 3A illustrates a single induction position sensor that can be used in embodiments of the present invention.

FIG. 3A illustrates a single inductive position sensor 300 that can be used in embodiments of the present invention. As is illustrated in FIG. 3A, transmitter coils 302 and receiver coils 304 are mounted on a printed circuit board (PCB) 314. Sensor 300 is shaped as an arc to measure a rotational motion. As such, transmit coils 302 and receiver coils 304 are also shaped in an arc. As is further discussed below, PCB 314 can form a half-circle or be any portion of a circular arc.

Transmitter coils 302 are driven by control circuits 306 to produce a time varying magnetic field. The time varying magnetic field induces eddy currents in a conducting target that is rotationally positioned over PCB 314. Sensor coils 304 typically include a sine-wave coil and a cosine-wave coil that generate a sine-wave or cosine-wave signal as the position of target 308 is changed. Consequently, control circuit 306 monitors the signals from sensor coils 304 to determine the position of target 308. As is illustrated in FIG. 3A, target 308 is coupled to a rotational unit or shaft 312, which can be turned. Consequently, the position of target 308 indicates the rotational position of shaft 312. Consequently, as part of a throttle control, a user can shaft 312 and the rotation can be determined by the position of target 308 over receiver coils 304.

Figure 3B:
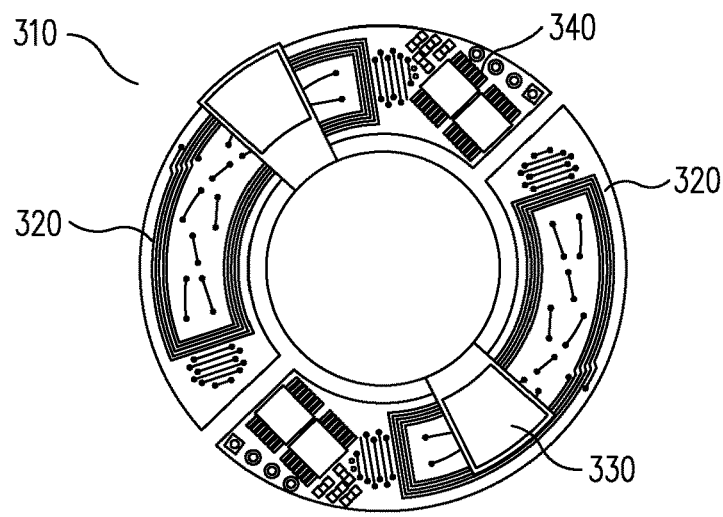
FIGS. 3B-3D illustrate example configurations for a position sensing system for an electronic throttle control according to some embodiments.
Figure 3C:
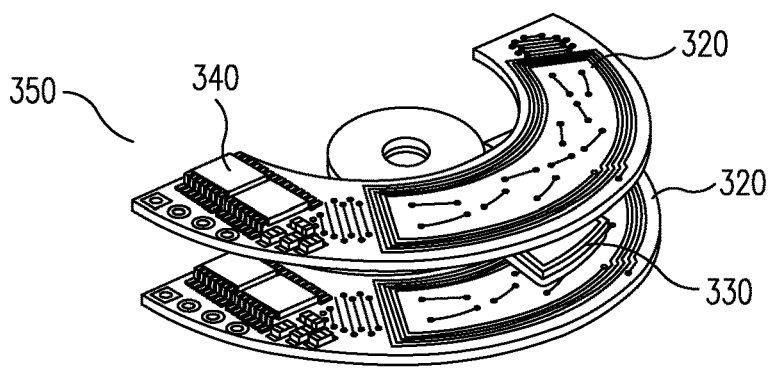
Figure 3D:
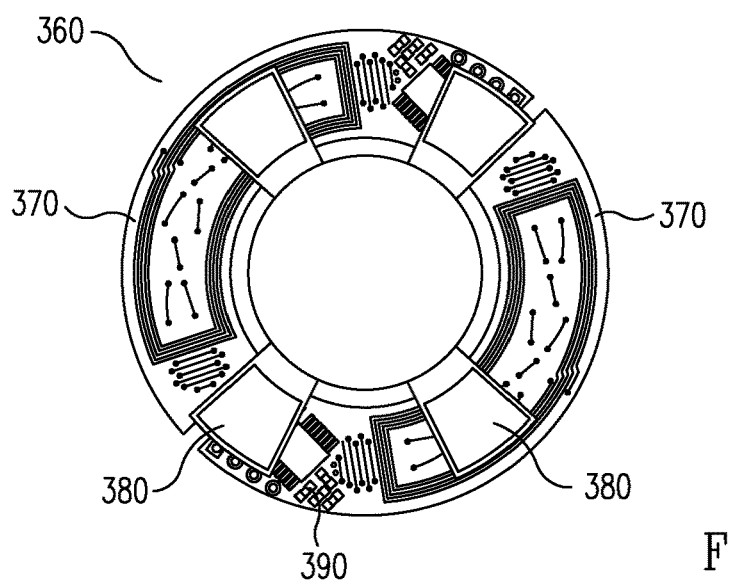

FIGS. 3B-3D illustrate example configurations for a position sensing system for an electronic throttle control according to some embodiments. FIG. 3B shows a side-by-side configuration 310 for an inductive sensor-based position detection assembly, such as is usable with position detection assemblies 140 and/or 240 utilizing inductor sensor 300 as illustrated in FIG. 3A. As shown in FIG. 3B, side-by-side configuration 310 includes two circuit boards 320 arranged concentrically to form a circle. Each of the circuit boards 320 includes detection circuitry 340 in the form of an integrated circuit, detecting circuit 340 coupled to transmitter coils and sensor coils as illustrated in FIG. 3A. In some embodiments, all of the sensor circuits can be formed on a single circuit board. The configuration is arranged and shaped according to the measurement range and, in many cases, may not provide a full 360° of measurement range.

A target 330 is associated with each circuit board 320 or each sensor circuit. And although side-by-side configuration 310 is shown with two circuit boards 320, side-by-side configuration 310 may include one, three, and/or four or more circuit boards. Each of the circuit boards 320 is in the shape of a sector of an annulus. In some examples, the center of the annulus of the circle (e.g., inside the circuit boards 320) is left open to allow space for a mounting shaft of the throttle control used to couple the throttle control to the handle bar. In some examples, a rotational axis of the mounting shaft is aligned with the center of the annulus. In some examples, (e.g., as shown), the circuit boards 320 may extend almost entirely around the circle, however, other configurations (not shown) may extend to less than the full 360 degrees around the circle depending upon the range of rotation allowed for a corresponding throttle control and thus a desired measurement range of the position detection assembly. In some examples, target 330 may be configured to be proximate to a corresponding circuit board 320 and/or a target 330 may be positioned on both sides of the corresponding circuit board 320. Thus, in the examples of FIG. 3B, up to four sensing targets 330 may be used with the two circuit board side-by-side configuration 310. In some examples, targets 330 may be of any suitable conducting material, such as a printed copper (and/or other conductive material) area on the corresponding circuit board 320. In some examples, a shape of a target 330 may be adjusted to allow for slots, holes, and/or the like for mounting the corresponding circuit board 320 and/or providing other structural support for target 330 and its attachment to a shaft such as shaft 312 as illustrated in FIG. 3A.

FIG. 3C shows a stacked configuration 350 for an inductive sensor-based position detection assembly, such as is usable with position detection assemblies 140 and/or 240 using induction sensor 300 as illustrated in FIG. 3A. As shown in FIG. 3C, stacked configuration 350 includes two circuit boards 320 (with corresponding targets 330 and detection circuitry 340) stacked relative to each other so that each of the circuit boards 320 and corresponding targets 330 occupy a same sector of the annulus around a center shaft and/or rotational axis of the throttle control. Other configurations are possible, for example with the circuit boards 320 being shifted angularly with respect to each other. And although stacked configuration 350 is shown with two circuit boards 320, stacked configuration 350 may use one, three, and/or four or more stacked circuit boards. In some examples, stacked configuration 350 provides redundancy as any of the circuit boards 320, targets 330, and detection circuitries 340 in the stack may be used to detect the position of the throttle control even though one or more of the other circuit boards 320, targets 330, and/or detection circuitries 340 may have failed. In some examples, the angle occupied by the angular sector is not limited to the depicted 180 degrees, but may be selected based on the range of rotation allowed for the throttle control and thus a desired measurement range of the position detection assembly. Similar to side-by-side configuration 310, the circuit boards 320 of stacked configuration 350 may include printed conductive areas to form transmit and receive coils and control circuits 340. Stacked configuration 350 can be configured so that targets 330 can be positioned on either or both sides of circuit boards 320 proximate to the sensor coils. As discussed above, targets can include structural features. In some examples, the circuit boards 320 of stacked configuration 350 may be connected to each other so as to distribute receiver coils between adjacent circuit boards 320, thus providing for self-compensating designs. In such configurations, targets can be positioned to rotate between adjacent boards 320 or may be positioned to rotate on opposite sides of the adjacent boards 320.

As such, stacked configuration 350 can provide multiple channels of redundancy, which provides for fail-safe systems in safety critical applications. Stacked configuration 350 illustrated in FIG. 3C are stacked on top of each other, but there may be mechanical shifting resulting in inaccuracies of measurement, which the redundancy will indicate.

FIG. 3D shows a multi-target configuration 360 for an inductive sensor-based position detection assembly, such as is usable with position detection assemblies 140 and/or 240. As shown in FIG. 3C, multi-target configuration 360 includes two circuit boards 370. Each of the circuit boards 370 is associated with two targets 380 that are rotatable over circuit boards 370 and detection circuitry 390, typically mounted on circuit boards 370. Multi-target configuration 360 is further shown with two circuit boards 370 in a side-by-side configuration similar to side-by-side configuration 310. Each of the circuit boards 370 is in the shape of a sector of an annulus. In some examples, the center of the annulus of the circle (e.g., inside the circuit boards 370) is left open to allow space for a mounting shaft of the throttle control used to couple the throttle control to the handle bar of a vehicle. In some examples, a rotational axis of the mounting shaft is aligned with the center of the annulus. Similar to side-by-side configuration 310 and stacked configuration 350, the circuit boards 380 of multi-target configuration 360 may include printed conductive areas forming transmit coils and receive coils, circuit ICs 390, structural features, and/or the like. Targets 380 can be arranged on either or both sides of circuit boards 370, In some examples, the use of multiple sensing targets 380 along the circuit boards 370 of multi-target configuration 360 may be used to reduce the angular area covered by the circuit boards 370 as a wider angular sensing range may be obtained using a circuit board 370 in comparison to a circuit board 320.

As discussed above and further emphasized here, FIGS. 3B-3D are merely examples which should not unduly limit the scope of the claims. One of ordinary skill in the art would recognize many variations, alternatives, and modifications. According to some embodiments, any combination of the side-by-side configuration 310, stacked configuration 350, and/or multi-target configuration 360 may be used in combination. In some examples, the combinations may include, but are not limited to, a configuration using both side-by-side and stacked circuit boards, a configuration using multi-target and stacked circuit boards, a configuration using side-by-side, multi-target, and stacked circuit boards, a configuration using side-by-side circuit boards with angular offsets in each stack of circuit boards, and/or the like.

Figure 4A:
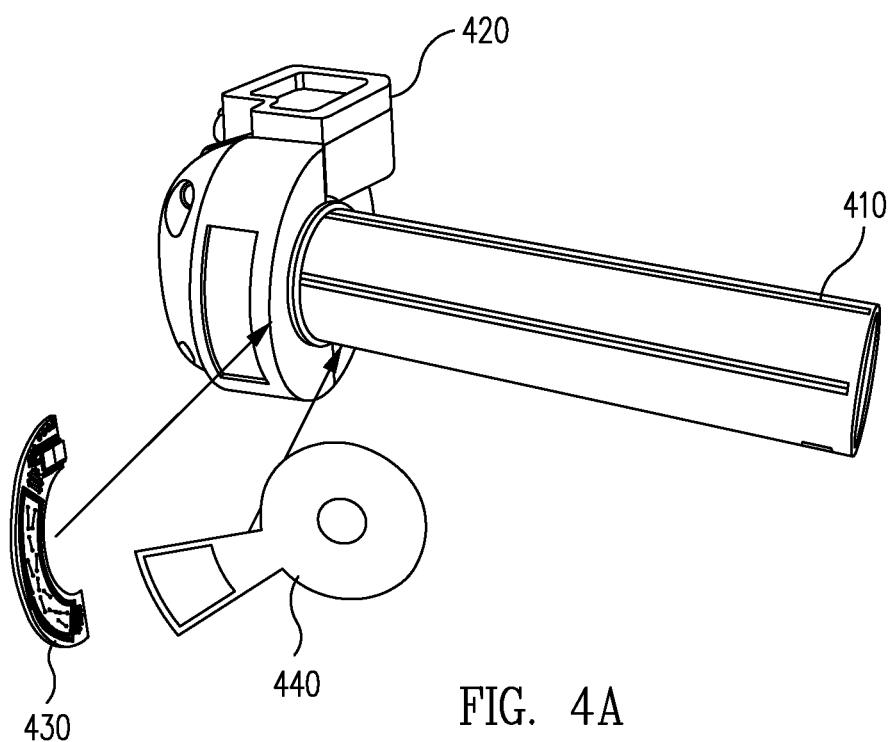
FIGS. 4A and 4B illustrate example before and after configurations of a positioning system for an electronic throttle control according to some embodiments.
Figure 4B:
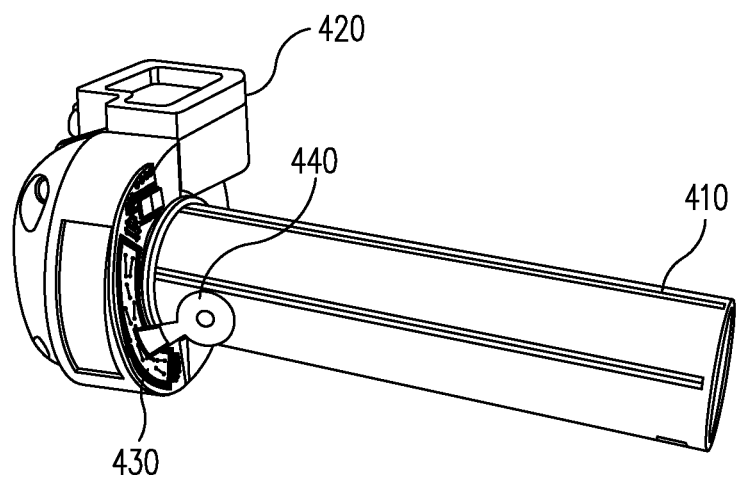

FIGS. 4A and 4B illustrate example before and after configurations of a positioning system for an electronic throttle control according to some embodiments. As shown in FIG. 4A, a throttle control 410 and position detection assembly 420 are shown before installation of a circuit board 430. In some examples, circuit board 430 may be consistent with any of the circuit boards 300, 320 and/or 370 as discussed above. Because circuit board 430 is not a full 360 degree circle, it is not necessary to insert a shaft of throttle control 410 through the center hole of circuit board 430, but rather circuit board 430 may be installed without removing throttle control 410 as shown in FIG. 4B. Thus, by using circuit board 430 without the full 360 degree circle, circuit board 430 may be installed, removed, and/or replaced in side-wise fashion. In some examples, this reduces assembly and/or repair costs. In some examples, this may additionally allow the use of a thin module design, which further saves in material costs.

Further, targets can be mounted on throttle control 410 so that as throttle control 410 is rotated, the target is rotatably moved over the sensor coils of circuit board 430.

The above detailed description is provided to illustrate specific embodiments of the present invention and is not intended to be limiting. Numerous variations and modifications within the scope of the present invention are possible. The present invention is set forth in the following claims.

What is claimed is:

1. A method of providing a throttle control, comprising:
positioning a plurality of circuit boards around a shaft such that the shaft rotates relative to the plurality of circuit boards, each of the plurality of circuit boards including an inductive position sensor having a transmission coil, sensor coils that include a sine-wave coil and a cosine-wave coil, and control circuitry that drives the transmission coil and receives signals from the sensor coils; and
providing one or more conductive targets mounted to the shaft and configured to be rotate over the plurality of circuit boards as the shaft is rotated relative to the plurality of circuit boards, positioned proximate the sensor coils of the plurality of circuit boards,
wherein the plurality of circuit boards are mounted concentrically around the shaft in one or more of a side-by-side configuration within a circuit around an annulus of the shaft and a stack configuration where the plurality of circuit boards occupy a same sector of the annulus around the shaft, and
wherein the position of the target is determined by the control circuitry as the shaft is rotated to determine the position of the shaft.

2. The method of claim 1, wherein each of the circuit boards occupies less than 180 degrees of the circular arrangement around the shaft.

3. The method of claim 1, wherein the plurality of circuit boards is arranged side-by-side to form a shape of a sector of an annulus around the shaft.

4. The method of claim 1, wherein the plurality of circuit boards are arranged in a stack.

5. The method of claim 1, wherein the plurality of circuit boards are stacked at an angular offset around the shaft relative to each other.

6. The method of claim 1, wherein the one or more targets includes a first target configured proximate to a first side of a respective circuit board of the plurality of circuit boards or a second side of the respective circuit board opposite the first side.

7. The method of claim 1, wherein the one or more targets includes a first target configured proximate a first side of a respective circuit board of the plurality of circuit boards and a second target configured proximate a second side of the respective circuit board.

8. The method of claim 1, wherein the one or more targets includes a first target configured proximate to a first side of a respective circuit board of the plurality of circuit boards and a second target configured proximate to the first side of the circuit board at a position different from a position of the first target.

* * * * *